US005082687A

United States Patent [19]

Ueba et al.

[11] Patent Number: 5,082,687

[45] Date of Patent: Jan. 21, 1992

[54] PROCESS FOR PRODUCING ORGANIC ELECTRICAL CONDUCTOR

[75] Inventors: Yoshinobu Ueba; Takayuki Mishima, both of Osaka; Gunzi Saito, Kanagawa, all of Japan

[73] Assignee: Sumitomo Electric Industries, Ltd., Osaka, Japan

[21] Appl. No.: 462,364

[22] Filed: Jan. 8, 1990

[30] Foreign Application Priority Data

| | | | |
|---|---|---|---|
| Jan. 7, 1989 | [JP] | Japan | 1-1451 |
| May 15, 1989 | [JP] | Japan | 1-122608 |

[51] Int. Cl.[5] .......................... B05D 5/12; C30B 29/54

[52] U.S. Cl. ........................................ 427/62; 156/600; 156/621; 156/DIG. 113; 505/811; 505/815; 252/510; 252/518; 420/62

[58] Field of Search ............. 156/600, 621, DIG. 113; 505/811, 815; 252/500, 510, 518; 549/3; 420/62

[56] References Cited

U.S. PATENT DOCUMENTS

| | | | |
|---|---|---|---|
| 3,944,578 | 3/1976 | Wolf et al. | 252/500 |
| 4,502,980 | 3/1985 | Denisevich et al. | 252/500 |
| 4,505,840 | 3/1985 | Kurkov | 252/500 |
| 4,519,937 | 5/1985 | Papir | 252/510 |
| 4,579,679 | 4/1986 | Papir | 252/518 |
| 4,883,922 | 11/1989 | Yokota et al. | 505/1 |

FOREIGN PATENT DOCUMENTS

| | | | |
|---|---|---|---|
| 0366970 | 5/1990 | European Pat. Off. | 156/600 |

OTHER PUBLICATIONS

Inoue et al., "Electroconductive Tetrathiafulvalene Salt of Copper Iodide $(TTF)_{4/3}CuI_2$", Inorganic Chemistry, 1987, vol. 26 (9), pp. 1462-1464.

Inorganic Chemistry, vol. 24, No. 16, Jul. 31, 1985, pp. 2465-2466, Easton, U.S.; H. H. Wang et al., entitled, "Ambient-Pressure Superconductivity at the Highest Temperature (5K) Observed in . . . 2AuI2".

Inorganic Chemistry, vol. 27, No. 6, Mar. 23, 1988, pp. 965-967, Easton, U.S.; K. D. Carlson et al., entitled, "Synthesis, ESR Studies, Band Electronic Structure, and Superconductivity . . . (m-Cu, Ag, Au)".

*Primary Examiner*—Robert Kunemund

*Attorney, Agent, or Firm*—Sughrue, Mion, Zinn Macpeak & Seas

[57] ABSTRACT

A process for producing an organic electrical conductor comprising the steps of: (1) dissolving or dispersing an electron-donating material and an electron-accepting material in a solvent containing an alcohol; and (2) forming and growing crystals of the organic electrical conductor by subjecting the dissolved or dispersed materials of step (1) to electrochemical oxidation-reduction.

6 Claims, No Drawings

PROCESS FOR PRODUCING ORGANIC ELECTRICAL CONDUCTOR

FIELD OF THE INVENTION

This invention relates to a process for producing an organic electrical conductor (hereinafter simply referred to as conductor) which can be used as an organic super conductive material, etc.

BACKGROUND OF THE INVENTION

Known organic conductors exhibiting super conductivity under normal pressure include bis(ethylenedithio)tetrathiafulvalene (hereinafter abbreviated as BEDT-TTF) compounds as disclosed in JP-A-61-277691 (the term "JP-A" as used herein means an "unexamined published Japanese patent application"), dimethyl(ethylenedithio)diselenathiafulvalene (hereinafter abbreviated as DMET) compounds as disclosed in JP-A-63-246383, and methylenedithiotetrafulvalene (hereinafter abbreviated as MDT) compounds as reported by G. C. Papauassiliou, et al. in International Conference on Science and Technology of Synthetic Metals, June 26–July 2, 1988, Santa Fe.

Further, organic conductors known to have a critical temperature (Tc) of 10 K or higher include cation radical salts, e.g., $(BEDT\text{-}TTF)_2Cu(NCS)_2$ and a deuteration product thereof, $(BEDT\text{-}TTFd_8)_2Cu(NCS)_2$, as described in H. Urayama, et al., Chem. Lett., 55 (1988).

Synthesis and crystal growth of organic conductors or super conductors are conducted by an electrolytic method in which an electron donating material (donor), e.g., BEDT-TTF, and an electron accepting material (acceptor), e.g., $I_3^-$ and $Cu(NCS)_2^-$, are dissolved in an organic solvent, and an electrical current of from 0.5 to 2 $\mu$A is passed therethrough to effect an electrochemical oxidation-reduction; or a diffusion method utilizing diffusion of the donor and acceptor.

However, the electrolysis method and diffusion method require a considerable time for synthesis and crystal growth of organic conductors. For instance, it takes from 1 week to 2 months to obtain crystals having a size of about 1 to 2 mm.

SUMMARY OF THE INVENTION

An object of this invention is to provide a process for producing an organic conductor in a reduced time.

Another object of this invention is to provide a process for producing a high quality organic conductor having a large crystal size.

Other objects and effects of this invention will be apparent from the following description.

This invention relates to a process for producing an organic electrical conductor comprising the steps of: (1) dissolving or dispersing an electron-donating material and an electron-accepting material in a solvent containing an alcohol; and (2) forming and growing crystals of the organic electrical conductor by subjecting the dissolved or dispersed materials of step (1) to electrochemical oxidation-reduction.

DETAILED DESCRIPTION OF THE INVENTION

According to the process of the present invention, the time required for synthesis and crystal growth of an organic conductor can be reduced and, also, high quality crystals of large size can be obtained. For example, in the production of $(BEDT\text{-}TTF)_2Cu(NCS)_2$, conventional processes using a solvent containing no alcohol needed anywhere from 1 week to 2 months to produce crystals of from 1 to 2 mm in size. In comparison, use of a solvent containing an alcohol according to the present invention makes it possible to produce crystals of from about 3 to 4 mm in 1 week, thus achieving crystal growth several times faster than is possible through conventional methods.

The reason for the marked increase in the rate of crystal growth brought about by the use of an alcohol-containing solvent has not yet been elucidated. It is considered that the solubility of inorganic electron-accepting materials, which have a low solubility in commonly employed solvents, is improved by the addition of an alcohol. The alcohol apparently increases the rate of reaction between the electron-donating material and electron-accepting material and thereby increases the rate of crystal growth.

The organic conductor that results from the present invention is a bulk super-conductor exhibiting 80% perfect diamagnetism as determined from magnetic susceptibility and having a critical temperature of 10.4 K (middle point) as determined from electrical resistance.

Examples of suitable electron donating materials which can be used in the present invention are TTF, BEDT-TTF, tetraaminoanthraquinone (TAAQ), dimethyl(ethylenedithio)diselena-dithiafulvalene (DMET), tetramethyltetraselenafulvalene (TMTSF), methylenedithiotetrathiafulvalene (MDT-TTF), tetramethyltetra-thiafulvalene (TMTTF), bis(2,3-butylenedithio)tetrathiafulvalene (BBDS-TTF), bis(1,2-propylenedithio)tetrathiafulvalene, 2,3-butylenedithio(ethylenedithio)tetrathiafulvalene, and 1,2-propylenedithio(ethylenedithio)tetrathiafulvalene; and these compounds with the sulfur atoms thereof replaced by selenium, tellurium or oxygen.

Examples of the electron donors with the sulfur atom thereof replaced by selenium, tellurium or oxygen are tetraselenafulvalene (TSeF), tetramethyltetraselenafulvalene (TMTSF), tetratellurafulvalene (TTeF), bis(ethylenediselena)tetrathiafulvalene (BEDSe-TTF), bis(ethylenediselena)tetraselenafulvalene (BEDSe-TSeF), bis(ethylenedithio)tetraselenafulvalene (BEDT-TSeF), bis(propylenediselena)tetrathiafulvalene (BPDSe-TTF), bis(2,3-butylenediselena)tetrathiafulvalene (BBDSe-TTF), and bis(ethylenedioxy)tetrathiafulvalene (BEDO-TTF).

Among the above electron donors, BEDT-TTF, DMET, TMTSF and MDT-TTF are preferred, and BEDT-TTF is more preferred as the electron donor.

In addition, these electron donors with a part or all of atoms thereof substituted with an isotope, e.g., heavy hydrogen, are also employable.

The electron-accepting materials which can be used in the present invention include $I_3$, $IBr_2$, $AuI_2$, $AuCl_2$, $AuBr_2$, $Au(CN)_2$, $(I_3)_{1-x}$ (wherein x is a positive number less than 1), $Hg_3Br_8$, $ClO_4$, $ReO_4$, $Cu(SCN)_2$, $Cd(SCN)_2$, $Zn(SCN)_2$, $Hg(SCN)_2$, $KHg(SCN)_4$, $HgCl_2$. $HgBr_2$, $HgI_2$. $Hg(CN)_2$. $Ni(dmit)_2$, $Pd(dmit)_2$. $PF_6$, $AsF_6$, $SbF_6$, $TaF_6$, and $FSO_3$. Among these, $I_3$ and $Cu(SCN)_2$ are preferred, and $Cu(SCN)_2$ is more preferred as the electron-accepting material.

Specific examples of the organic conductor obtained in the present invention are $(TMTSF)_2X^1$ (wherein $X^1$ represents $ClO_4$, etc.), $(BEDT\text{-}TTF)_2X^2$ (wherein $X^2$ represents $Cu(SCN)_2$, etc.), $(DMET)_2X^3$ (wherein $X^3$ represents $AuBr_2$, etc.), $(MDT\text{-}TTF)_2X^4$ (wherein $X^4$ represents $AuBr_2$, etc.), TTF[Me(dmit)$_2$] (wherein Me represents Ni, Pd, etc.), and $(CH_3)_4N[Ni(dmit)_2]_2$. Among these, $(BEDT\text{-}TTE)_2Cu(NCS)_2$ is preferred in the present invention.

Solvents which can be used in the present invention include 1,1,2-trichloroethane, tetrahydrofuran (THF), 1,2-dichloroethane, dichloromethane, chlorobenzene, fluorobenzene, anisole, acetonitrile, and benzonitrile. Among these, 1,1,2-trichloroethane and THF are preferably used in the present invention.

A raw material forming the anion $Cu(NCS)_2^-$ includes $(n\text{-}Bu_4N)SCN$ (wherein Bu represents a butyl group) and CuSCN.

The alcohol which is added to the solvent is not particularly limited and includes, for example, methanol, ethanol, propanol, isopropanol, n-butanol, sec-butanol, t-butanol, and pentanol. The alcohol is preferably methanol, ethanol or propanol, and more preferably ethanol.

The amount of the alcohol to be added is appropriately selected depending on the kind of the solvent, solubility of the donor molecule, and the like and is usually in the range of from 0.1 to 10% by weight, preferably from 0.5 to 5% by weight, more preferably from 1 to 2% by weight, based on the solvent. If the alcohol content exceeds 10%, solubility of the electron-donating material tends to be reduced which brings a failure of smooth snythesis or crystal growth of organic conductors. If the alcohol content is less than 0.1%, significant increase in crystal growth rate or crystal size tend to be failed.

The amount ratio and the concentrations of the electron donor and the electron-accepting material are not particularly limited, but the electron donor and the electron-accepting material are preferably present in a high concentration as possible. For example, the Synthesis and crystal growth is preferably carried out in which the electron donor and the electron-accepting material are added in an excess amount and their concentrations are maintained at substantially saturated concentrations when they are consumed by the reaction.

The synthesis of the organic conductor and crystal growth by oxidation-reduction reaction can be carried out in accordance with known electrolytic techniques.

The higher the electrical current in the electrolysis, the faster the crystal growth. However, at a current of about 50 μA, extremely small crystals that fail to grow into satisfactory plate crystals tend to form rapidly. Accordingly, a preferred current ranges is from about 0.5 to 20 μA, more preferably from 0.5 to 10 μA. A current range of from 0.5 to 1 μA is most preferred for wire electrodes having an diameter of 1 mm. The electrolysis temperature ranges from about 5° C. to about 50° C., preferably from about 10° C. to about 30° C. At temperatures lower than about 5° C. crystal growth is retarded. At temperatures higher than about 50° C., crystals hardly grow.

Materials of electrodes include, for example, Ni, Pd, Pt, Au, W, p-type and n-type silicon, indium oxide coated glass, indium oxide coated polyester films, and NESA glass. Electrodes that contain Pt give particularly satisfactory results. The electrodes may be of any known configuration such as rod shape, a plate shape, a cylindrical shape, a mesh structure, a porous structure, and so on.

An organic conductor or super-conductor according to the present invention is of lighter weight and easier to synthesize and process at lower temperatures compared to metallic super-conductive materials. As a result, it can be utilized in a wide variety of forms, such as film, tape, fiber, powder, etc.; it can be utilized either alone or in the form of a composite with polymers; and it can also be utilized in the form of a thin membrane. The organic conductor or super-conductor of the invention is thus useful in various applications, such as wires, tapes, strip lines, wiring, and devices.

The present invention is now illustrated in greater detail by way of the following nonlimiting Examples. In these Examples, all the percents are by weight unless otherwise specified.

EXAMPLES 1 TO 10

In a cell for crystal growth whose atmosphere had been displaced with nitrogen were put 30 mg of BEDTTF, 70 mg of CuSCN, 126 mg of KSCN, and 210 mg of 18-crown-6-ether as a catalyst. Subsequently, 1,1,2-trichloroethane and ethanol (of electronics industry grade) or methanol (having a ultra-low water content) were added thereto as a solvent in amounts shown in Table 1 below using an injector. The mixture, shielded from light, was stirred overnight in a nitrogen atmosphere. After any insoluble matter was allowed to precipitate, platinum electrodes 1 mm in diameter were fixed to the cell in a nitrogen stream.

The cell was put in an oven whose temperature was controlled by a thermostat set at 20.0°±0.2° C. After the temperature reached a stable state, a direct current of a value shown in Table 1 below was applied to the electrodes to start the synthesis and crystal growth of an organic conductor.

COMPARATIVE EXAMPLES 1 AND 2

The same procedure of Examples 1 to 4 was repeated, except 100 ml of 1,1,2-trichloroethane alone was used as a solvent. The thermostat temperature was set at 20.0°±0.2° C. for Comparative Example 1 or about 40° C. for Comparative Example 2 during electrolysis.

TABLE 1

| No. | 1,2-Trichlor-ethane (ml) | Ethanol (ml) | Metha-nol (ml) | Alcohol content in solvent (wt %) | Current (μA) |
|---|---|---|---|---|---|
| Example 1 | 99 | 0.9 | 0 | 0.5 | 0.50 ±0.02 |
| Example 2 | 99 | 1.8 | 0 | 1 | 0.50 ±0.02 |
| Example 3 | 96 | 3.6 | 0 | 2 | 0.50 ±0.02 |
| Example 4 | 91 | 8.7 | 0 | 5 | 0.50 ±0.02 |
| Example 5 | 83 | 16.8 | 0 | 10 | 0.50 ±0.02 |
| Example 6 | 98 | 0 | 1.8 | 1 | 0.05 ±0.02 |
| Example 7 | 96 | 0 | 3.6 | 2 | 0.50 ±0.02 |
| Example 8 | 91 | 0 | 8.7 | 5 | 0.50 ±0.02 |
| Example 9 | 96 | 3.6 | 0 | 2 | 10 ±0.02 |
| Example 10 | 96 | 3.6 | 0 | 2 | 47 ±3 |
| Comparative Examples 1 and 2 | 100 | 0 | 0 | 0 | 0.50 ±0.02 |

The BEDT-TTF used above was prepared by purifying a commercially available product by recrystallization (melting point: 242° C.). The KSCN used above was prepared by recrystallization from ethanol, drying under reduced pressure at room temperature, maintaining at 150° C. for 1 hour and then at 200° C. for 15 minutes to remove the solvent, cooling in a desicator, and grinding in a mortar. The CuSCN and 18-crown-6-ether used above were prepared by drying commercially available reagents under reduced pressure. The 1,1,2-trichloroethane used as a solvent was prepared by washing with a 10% sodium hydroxide aqueous solution and a sodium chloride aqueous solution, drying over calcium chloride for at least 1 day, followed by distillation (boiling point: 113°-113.5° C.). The purified 1,1,2-trichloroethane was used immediately after distillation. All the equipment was used after thorough drying. The platinum electrodes were used immediately after heating on a burner.

The mode of crystal growth in a prescribed period of time in Examples 1 to 10 and Comparative Examples 1 and 2 are in Table 2 below. After completion of the crystal growth, the crystals formed were collected on a filter, washed with an alcohol, dried at room temperature under reduced pressure, and weighed. The yield of the crystals is also shown in Table 2 below. All the grown crystals were plate-like, and the size of the crystals shown in Table 2 is the maximum length in terms of mm.

In particular, in Examples 2 and 3 started with 1 and 2% ethanol, respectively, the crystals grew to a size of 3 to 4 mm in about 5 days and to a size of 5 mm in about 7 days. Thus, the crystals in these Examples grew faster axid the crystals were of larger size compared to those in Examples 1, 4, and 5 started with 0.5, 5, or 10% ethanol or Examples 6 to 8 started with methanol.

With respect to the electrolysis current, in Example 9 a current of 10 μA, which was higher than that of Examples 1 to 8, was applied. The crystals grew to 11 mm in 5 days. Thus, compared with Example 3 in which 0.5 μA was used with the other conditions being the same, Example 9 showed faster crystal growth, produced crystals of larger size, and at an increased yield. In Example 10, 47 μA was applied and although crystal precipitation took place immediately after the start of electrolysis no growth of plate crystals was observed except for precipitation of crystallites.

In addition, the results of Table 2 reveal that the addition of ethanol also increases yield.

The critical temperature (Tc) of the resulting crystals was determined by measuring magnetic susceptibility. All of the crystals obtained in Examples 1 to 10 and Comparative Examples 1 were found to exhibit diamagnetism at 9.8° K. The electrical resistance of the crystals obtained in Examples 2 and 3 was determined using a four-terminal network and in both a sharp reduction in resistance was noted at around 11° K. These results reveal that the crystals were super conductors.

TABLE 2

| No. | Crystal growth time (day) 1 | 2 | 5 | 7 | 14 | Yield (mg) |
|---|---|---|---|---|---|---|
| Example 1 | — | — | 1 | 1.5 | 1.7 | 4.5 |
| Example 2 | nucleus formation | nucleus formation | 2-3 | 4-5 | 5 | 18.8 |
| Example 3 | nucleus formation | nucleus formation | 3-4 | 4-5 | 5 | 19.3 |
| Example 4 | no change | nucleus formation | 0.1 | 0.2 | 0.2-0.5 | 12.1 |
| Example 5 | no change | nucleus formation | 0.1 | 0.1 | 0.1-0.5 | 17.6 |
| Example 6 | nucleus formation | — | 0.8 | 1.1 | 1.6 | 8.0 |
| Example 7 | nucleus formation | — | 0.4 | 0.5 | 1.0 | 7.0 |
| Example 8 | no change | — | 0.2 | 0.2 | 0.6 | 10.0 |
| Example 9 | nucleus formation | — | 11 | — | — | 26.0 |
| Example 10 | many crystallites formed | — | — | — | — | 17.0 |
| Comparative Example 1 | no change | no change | nucleus formation | nucleus growth | 0.2 | 13.8 |
| Comparative Example 2 | no change | no change | no change | no change | no change | 0 |

In Comparative Example 2 where the solvent contained no alcohol and the electrolysis was conducted at 40° C., virtually no crystal growth was observed. In Comparative Example 1 where the solvent contained no alcohol and the electrolysis was conducted at 20° C.±0.2, formation of ultrafine black crystal nuclei on the platinum anode was observed within 5 days from the start of crystal growth, but this crystal nuclei eventually grew to only about 0.2 mm in 14 days.

It can be seen that addition of ethanol (Examples 1 to 4) or methanol (Examples 6 to 8) to the solvent accelerated crystal nucleus formation by several days. These Examples show that crystals having a size of about 0.1 to 5 mm can be obtained in around 7 days.

According to the present invention, synthesis and crystal growth of an organic conductor and an organic super-conductor can be achieved in a reduced time. The process of the present invention is, therefore, suitable for mass-production of organic conductors and organic super-conductors. Additionally, the process produces crystals of large size and high quality.

While the invention has been described in detail and with reference to specific embodiments thereof, it will be apparent to one skilled in the art that various changes and modifications can be made therein without departing from the spirit and scope thereof.

What is claimed is:

1. A process for producing an organic electrical conductor comprising the steps of:

(1) dissolving or dispersing an electron-donating material and an electron-accepting material in a solvent containing an alcohol; and (2) forming and growing crystals of said organic electrical conductor by subjecting said dissolved or dispersed materials of step (1) to electrochemical oxidation-reduction.

2. A process as claimed in claim 1, wherein said alcohol is present in an amount of from about 0.1 to 10% by weight based on the total amount of said solvent.

3. A process as claimed in claim 1, wherein said step of forming and growing crystals is carried out by electrolysis using a current of from about 0.5 to 20 μA.

4. A process as claimed in claim 1, wherein said step of forming and growing crystals is carried out at a temperature of from about 5° to 50° C.

5. A process as claimed in claim 1, wherein said step of forming and growing crystals is carried out at a temperature of from about 10° to 30° C.

6. A process as claimed in claim 1, wherein said step of forming an growing crystals is carried out by using electrodes containing Pt.

* * * * *